United States Patent [19]

Luhman et al.

[11] 4,343,867
[45] Aug. 10, 1982

[54] SUPERCONDUCTING WIRE WITH IMPROVED STRAIN CHARACTERISTICS

[75] Inventors: Thomas Luhman, Westhampton Beach; Carl J. Klamut, E. Patchogue; Masaki Suenaga, Bellport; David Welch, Stony Brook, all of N.Y.

[73] Assignee: The United States of America as represented by the United States Department of Energy, Washington, D.C.

[21] Appl. No.: 284,858

[22] Filed: Jul. 20, 1981

Related U.S. Application Data

[60] Division of Ser. No. 105,439, Dec. 19, 1979, which is a continuation-in-part of Ser. No. 966,709, Dec. 5, 1978, abandoned.

[51] Int. Cl.³ .............................................. B32B 15/01
[52] U.S. Cl. ..................................... 428/614; 75/154; 174/126 S; 174/128 S; 428/662; 428/930
[58] Field of Search ............................. 75/154–157, 75/174; 428/606, 607, 611, 614, 662, 674, 929, 930; 148/11.5 F, 11.5 Q, 133; 174/126 S, 128 S

[56] References Cited

U.S. PATENT DOCUMENTS

| | | | |
|---|---|---|---|
| 1,776,948 | 9/1930 | Krans | 75/154 |
| 2,136,919 | 11/1938 | Hensel et al. | 75/154 |
| 2,143,914 | 1/1939 | Hensel et al. | 75/154 |
| 3,325,307 | 6/1967 | Neugebauer et al. | 427/34 |
| 3,728,165 | 4/1973 | Howlett | 428/642 |
| 3,731,374 | 5/1973 | Suenaga et al. | 428/642 |
| 3,884,683 | 5/1975 | Kawabe et al. | 148/133 |
| 3,905,839 | 9/1975 | Hashimoto | 428/930 |
| 3,910,802 | 10/1975 | Wong | 428/646 |
| 3,918,998 | 11/1975 | Marancik et al. | 148/127 |
| 3,926,684 | 12/1975 | Howe | 428/662 |
| 3,985,281 | 10/1976 | Diepers et al. | 427/62 |
| 4,043,888 | 8/1977 | Gavaler | 427/62 |
| 4,135,293 | 1/1979 | Madsen et al. | 174/126 S |
| 4,224,087 | 9/1980 | Tachikawa et al. | 29/599 |
| 4,262,412 | 4/1981 | McDonald | 428/642 |

FOREIGN PATENT DOCUMENTS 47-44421 9/1972 Japan .................................. 428/675

OTHER PUBLICATIONS

"Niobium–Tin Superconductors for Industry", *Tin and Its Uses*, pp. 11–12, No. 109.

Suenaga, M., et al., "Superconducting Properties of Multi Filamentary $Nb_3Sn$ made by a new Process", *Appl. Phys. Letters*, vol. 20, pp. 443–445, (6/72).

*Primary Examiner*—Michael L. Lewis
*Attorney, Agent, or Firm*—Cornell D. Cornish; Richard G. Besha; James E. Denny

[57] ABSTRACT

A superconducting wire comprising a superconducting filament and a beryllium strengthened bronze matrix in which the addition of beryllium to the matrix permits a low volume matrix to exhibit reduced elastic deformation after heat treating which increases the compression of the superconducting filament on cooling and thereby improves the strain characteristics of the wire.

4 Claims, 3 Drawing Figures

SUPERCONDUCTING WIRE WITH IMPROVED STRAIN CHARACTERISTICS

BACKGROUND OF THE INVENTION

The invention described herein was made or conceived in the course of, or under a contract with, the United States Department of Energy.

This application is a divisional of co-pending application Ser. No. 105,439, filed Dec. 19, 1979, which application is a continuation in part of application Ser. No. 966,709, filed Dec. 5, 1978, now abandoned.

1. Field

The invention relates to improvement in superconducting wires and, in particular, to means for improving the strain characteristic of such wires.

2. Prior Art

Twenty-four metallic elements and more than 1,000 alloys exhibit a characteristic known as superconductivity. These materials, when cooled to near zero degrees Kelvin, exhibit zero resistivity. The zero resistivity characteristic of many superconducting materials is lost when the material is subject to a strong magnetic field, making them unsuitable for use in the production of electromagnets.

A number of compounds, including the intermetallics niobium-tin ($Nb_3Sn$) and vanadium-gallium ($V_3Ga$), have been found to retain their superconducting properties in the presence of magnetic fields above 200 kilogauss.

Since there is no ohmic loss in a material exhibiting zero resistivity, a small gauge superconducting wire is capable of carrying high currents. Consequently, very compact, high field strength electromagnets are now possible. These electromagnets are considerably smaller than comparable devices employing copper windings and water cooling.

Superconductors such as niobium-tin and vanadium-gallium are brittle and can be easily damaged, especially when drawn into fine filamentary wire and wound for use in electromagnets. To produce a serviceable wire, the superconducting filament is provided with supporting material, usually referred to as a matrix.

An example of a superconductor, supported by a matrix, is a matrix of bronze surrounding a center filament of a metal such as niobium. During a heat treating step in the fabrication of the wire, the niobium reacts with the tin in the bronze to form a superconducting film of niobium-tin at the interface of the bronze and niobium.

The structure of a more practical wire is similar to that described above with the exception that multiple fine filaments of niobium, rather than a single filament, are embedded in the matrix.

Typically, a matrix contains a number of niobium filaments. Each filament is surrounded by a superconducting film of niobium-tin at the interface between the niobium and the matrix.

When practical wires are made and are properly heat treated, virtually all of the niobium in the fine filaments is converted to niobium-tin; however, for the sake of brevity, the portion of niobium converted to niobium-tin will be referred to herein as the superconducting film regardless of its thickness in each case.

In addition to the two structures described above, other practical structures are possible including tapes in which the superconductor is contained within a tape matrix.

The ratio of the diameter of the matrix material to that of the filament in a single filament wire is typically in the order of two or three to one. Although much higher ratios such as ten to one may be fabricated, the lower ratios are practical from the standpoint of cost, volume and current carrying capability per unit cross section.

The bendings of the superconducting wire cause the portion of the wire at the outside of the bend to be elongated or strained. The wire can also be strained by a tensile force occurring during the winding, or operation of an electromagnet. This strain extends through the matrix to the superconductor. Sufficient strain can adversely affect the current carrying capacity and even produce an irreversible reduction in current capacity.

SUMMARY

An object of the present invention is the production of superconducting wire or tape with improved strain characteristics. A second object is the production of superconducting wire or tape in which the strain produced by the bending of the wire or the application of a tensile force in normal use increases the effective range of critical current carrying capacity.

The addition of an unusually small percentage of beryllium, ranging from 0.01 to 0.2 percent by weight, to a low volume, bronze matrix for a superconducting film adds sufficient tensile strength to the matrix during a heat treating process to hold the superconducting filament under greater compression, both radial and axial, upon its formation than has been obtained previously with a similarly sized matrix. The higher compression increases the strain limits and provides a more rugged wire with a higher useful current carrying capacity.

DETAILED DESCRIPTION

Figure 1A:
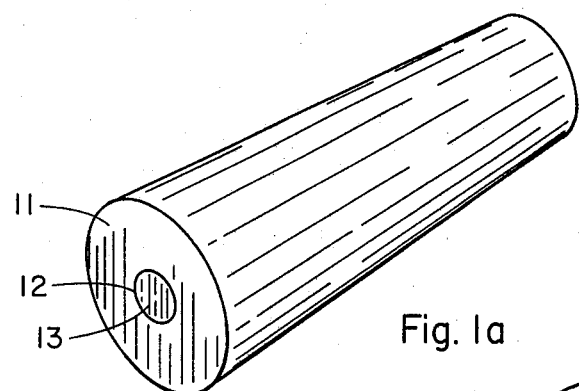
FIG. 1A is a perspective view of a superconducting wire in which the matrix surrounds a single superconducting filament, said matrix containing a small percentage of beryllium.

A superconducting wire according to the present invention is shown in FIG. 1A. A matrix 11 of bronze surrounds a center 13 of a metal such as niobium. During a heat treating step in the fabrication of the wire the niobium reacts with the tin in the bronze to form a superconducting film of niobium-tin at the interface 12 of matrix 11 and center filament 13.

In accordance with the present invention matrix 11 contains a small amount of beryllium, the amount being chosen so as to strengthen matrix 11 sufficiently to achieve the advantages of the present invention, as will be more fully described below, while still allowing the wire of the present invention to be produced by the typical fabrication process, described below, without requiring additional annealling steps. This amount is preferably from 0.01 to 0.2 weight percent and still more preferably about 0.18 weight percent.

Figure 1B:
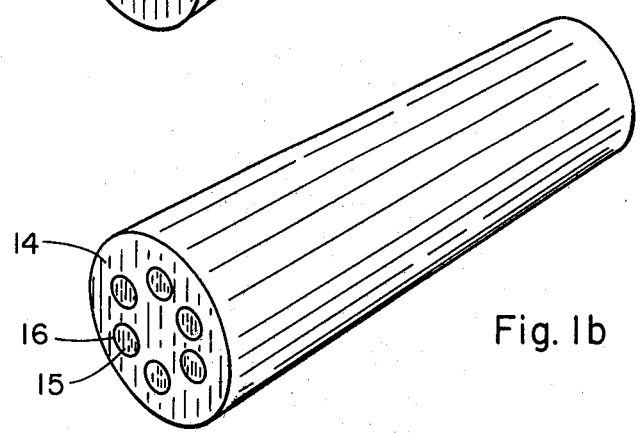
FIG. 1B is a perspective view of a superconducting wire in which the matrix surrounds the superconducting filaments, said matrix containing a small percentage of beryllium.

A more practical wire is shown in FIG. 1B where matrix 14 surrounds a plurality of fine filaments 15. During heat treating a plurality of superconducting films are formed at interfaces 16. In accordance with the present invention matrix 14 contains approximately the same percentage of beryllium as matrix 11.

It is within the contemplation of this invention to also form superconducting wires wherein matrices 11 and 14 comprise copper-gallium alloy and filaments 13 and 15 comprise vanadium, and where superconducting films of vanadium-gallium are formed at interfaces 12 and 16.

The superconductive behavior of a material is lost when the current exceeds a limit referred to as the critical current density. During the measurement of critical current density, a superconducting wire is maintained within a temperature range in which the wire exhibits superconductive behavior, while the wire is subject to a magnetic field. For example, the critical current density of niobium-tin is approximately 1,500,000 amperes per square centimeter when this superconductor is subject to a magnetic field strength of 40 kilogauss. The critical current density for vanadium-gallium ranges from roughly one-half to the same as that of niobium-tin, under the same conditions.

The critical current density is an important parameter indicating the maximum current carrying capacity of a wire. This capacity is reduced or increased depending on the strain on the wire.

Figure 2:
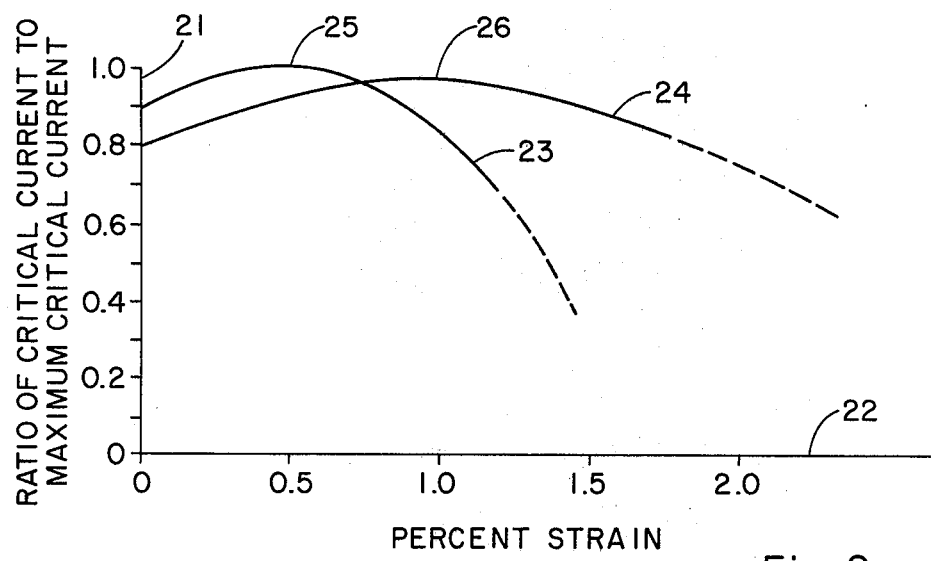
FIG. 2 is a graph illustrating the improvement in the strain characteristics of a superconducting wire achieved by means of the present invention.

The effect of strain on the critical current density is shown in the graph of FIG. 2. In this figure, the ordinate 21 represents the ratio of the critical current density to the maximum critical current density, while the abscissa 22 represents the percent strain.

Two characteristics have been plotted. The first plot 23 represents the characteristic of a prior art wire, while the second plot 24 represents that of a wire produced in accordance with the present invention. Both wires have the configuration shown in FIG. 1A. The ratio of the bronze matrix 11 diameter to that of the niobium filament 13 is 2.5 to 1 and the tin content in the bronze matrix 11 is 11.5 percent by weight. A preferred wire produced in accordance with the present invention includes 0.18 percent by weight of beryllium in the matrix 11, while the prior art matrix contains no beryllium.

The addition of this unusually small percentage of beryllium is significant. As can be seen from the plots, the critical current density rises, reaches a maximum, and then falls as the percent strain is increased. The maximum for the prior art wire indicated by drawing numeral 25 is reached at 0.6 percent strain, while the maximum for the present invention indicated by drawing numeral 26 is at the appreciably higher level of 1.0 percent strain. At 1.0 percent strain, the prior art wires current carrying capacity has dropped over 10 percent. The represents a loss in current carrying capacity of about 150,000 amperes per square centimeter.

As the strain is increased to 1.25 percent, the prior art wire reaches a point of irreversible loss in current carrying capacity, indicated by the dashed portion of the plot, while the present invention does not reach the point of irreversible loss until the strain is increased to 1.75 percent. A the 1.25 percent strain level, the wire fabricated in accordance with the present invention shows a loss in current carrying capacity of only five percent, while the prior art wire shows a 35 percent loss.

In practical applications involving a tensile force or bending of the wire, the wire produced in accordance with the present invention may be strained to one percent or more, where it is at or near its maximum current carrying capacity, whereas prior art wire, if so strained, loses from 10 to 35 percent of its capacity and is placed close to the point at which irreversible loss in capacity occurs.

It is apparent that the present invention offers an advantage in providing a maximum in current carrying capacity after having been subject to a strain which would tend to degrade or destroy the prior art wire and the present invention can withstand greater strain before irreversible loss in capacity occurs.

The rise occurring in the critical current as strain is increased has been noted in prior art wires: however, the reason for the rise had not been clearly ascertained.

It has been determined that the matrix places the superconductor in compression, both radial and axial, during a heat treatment step in the fabrication process. In this step, the temperature of the wire is elevated to about 650°–800° centigrade, and then cooled. During the cooling period, the difference in the coefficients of thermal expansion between the matrix and the niobium-tin causes the outer bronze matrix to contract more than the niobium-tin, placing the niobium-tin under compression.

Where the ratio of the matrix diameter to that of the niobium-tin is ten to one, there is little plastic deformation of the bronze matrix. Essentially, the bronze contracts by the amount it would if there were no niobium-tin in the wire; however, as the ratio of diameters is reduced below ten to one, there is an increase in the plastic deformation of the matrix accompanied by a corresponding decrease in the compression of the niobium-tin. The addition of the small percentage of beryllium to the matrix adds strength at high temperatures to reduce the amount of plastic deformation of the matrix and thereby increase the compression on the niobium-tin, especially in wire having a ratio of matrix volume to filament volume of about from 1–5.

Compression or tension of a superconductor, such as niobium-tin, reduces the critical current density. The falloff in critical current density on either side of the maximum, or zero compression point, is evident in FIG. 2. This effect was noted to some degree in prior art devices where the slight bending of a wire increased the critical current; however, this characteristic was not viewed as a means of increasing the strain limits.

Wires fabricated in accordance with the present invention receive essentially the same processing steps as do wires which employ a purely bronze matrix. There is no significant increase in the work-hardening effect on the matrix and no additional annealing steps are incurred because of the addition of the beryllium.

In a typical fabrication process, a rod of bronze containing 0.1 percent beryllium and from 11 to 14 percent tin by weight is machined to produce a longitudinal cavity designed to accept a rod of niobium. The niobium may be essentially pure or alloyed with a small percentage of other elements. The niobium rod is inserted in the cavity to form a composite bar which is repeatedly passed through dies to reduce the diameter of the bar to that of a wire. Alternatively, the wire may be formed by an extrusion process. Equivalent wire forming processes will be referred to generally as drawing processes. As required, during the drawing process, the wire is annealed at 300 to 450 degrees centigrade for a period of approximately 5 to 25 minutes, depending on the particular annealing temperature chosen. In the final step, the wire temperature is elevated to 725° centigrade for a period of hours, depending on the desired thickness of the niobium-tin film. A six hour period at 725° produced a 1.5 micron thick film.

Vanadium-gallium is similar to niobium-tin in that compression and tension reduce the critical current density and a vanadium-gallium wire may be fabricated in the same manner as the niobium-tin wire described above with the exception that the matrix contains 16 to 19 weight percent of gallium in place of tin and a vanadium rod is substituted for the niobium rod.

Although a circular cross section has been chosen for exemplary purposes herein, other forms of conductors employing the same principles are considered as being within the scope of the invention. For example, an equivalent form is a beryllium strengthened ribbon matrix on which the superconducting layer is bonded. Other obvious configurations are possible without departing from the scope of the invention. Having described our invention we set forth our claims below.

We claim:

1. A superconductor wire having improved resistance to loss of current-carrying capacity when subjected to strain, said superconductor wire comprising at least one filament of a material possessing superconducting properties, said filament being encased in a matrix consisting essentially of up to about 0.2 beryllium and gallium-copper alloy having a coefficient of thermal expansion greater than that of said filament, said matrix containing beryllium in an effective concentration sufficient to induce and maintain said filament under greater radial and axial compression than that provided by such matrix without the beryllium addition, said filament further comprising a film of vanadium-gallium providing said superconducting properties.

2. A superconductor wire as described in claim 1 in which the gallium content of said alloy is within the range of 16 to 19 percent by weight.

3. A superconductor wire as described in claim 1 or 2 in which said beryllium is present in said matrix in the range of 0.01 to 0.2 weight percent.

4. A superconducting wire having improved resistance to loss of current-carrying capacity when subjected to strain, said wire comprising at least one filament of a material possessing superconducting properties, said filament comprising a film of vanadium-gallium providing said superconducting properties and said filament being encased in a matrix having a coefficient of thermal expansion greater than that of said filament, said matrix consisting essentially of copper alloy with 16 to 19 percent by weight of gallium and 0.01 and 0.2 percent by weight of beryllium, whereby the tensile strength of said matrix is increased sufficiently to induce and maintain said filament under greater radial and axial compression than provided by such a matrix without the beryllium addition.

* * * * *